US009495489B2

(12) United States Patent
Carlin et al.

(10) Patent No.: US 9,495,489 B2
(45) Date of Patent: Nov. 15, 2016

(54) CORRELATION OF TEST RESULTS AND TEST COVERAGE FOR AN ELECTRONIC DEVICE DESIGN

(71) Applicant: Freescale Semiconductor, Inc., Austin, TX (US)

(72) Inventors: Alan J. Carlin, Austin, TX (US); Hugo M. Cavalcanti, Austin, TX (US); Jonathan W. McCallum, Austin, TX (US); Huy Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 14/293,289

(22) Filed: Jun. 2, 2014

(65) Prior Publication Data
US 2015/0347645 A1  Dec. 3, 2015

(51) Int. Cl.
*G06F 17/50* (2006.01)

(52) U.S. Cl.
CPC ....... *G06F 17/5009* (2013.01); *G06F 17/5045* (2013.01); *G06F 17/5022* (2013.01); *G06F 17/5081* (2013.01); *G06F 2217/14* (2013.01)

(58) Field of Classification Search
CPC .......... G06F 17/5081; G06F 17/5022; G06F 17/5009; G06F 17/5045; G06F 2217/14
USPC ....................... 716/111, 106, 136, 52; 703/16
See application file for complete search history.

(56) References Cited

U.S. PATENT DOCUMENTS

| | | | | |
|---|---|---|---|---|
| 4,677,587 A | * | 6/1987 | Zemany, Jr. ........ | G06F 17/5009 703/13 |
| 4,866,663 A | * | 9/1989 | Griffin ................ | G06F 17/5009 703/2 |
| 5,684,946 A | * | 11/1997 | Ellis .................... | G06F 17/5022 714/33 |
| 5,870,590 A | * | 2/1999 | Kita .................... | G06F 11/3604 716/103 |
| 6,038,378 A | * | 3/2000 | Kita .................... | G06F 11/3684 714/38.11 |
| 6,718,521 B1 | * | 4/2004 | Bentlage ............. | G06F 17/5022 716/106 |
| 6,779,135 B1 | * | 8/2004 | Ur ....................... | G06F 11/3676 714/37 |
| 7,467,364 B2 | | 12/2008 | Hekmatpour | |
| 8,413,088 B1 | * | 4/2013 | Armbruster ......... | G06F 17/5022 716/100 |
| 9,213,787 B1 | * | 12/2015 | O'Donovan ........ | G06F 17/5009 |
| 2001/0010091 A1 | * | 7/2001 | Noy .................. | G01R 31/31835 716/106 |
| 2007/0168172 A1 | * | 7/2007 | Hong .................. | G06F 17/5036 703/14 |
| 2008/0005709 A1 | * | 1/2008 | Golander ............ | G06F 17/5031 716/108 |
| 2008/0127009 A1 | | 5/2008 | Veneris et al. | |

(Continued)

OTHER PUBLICATIONS

Zissis Poulos et al. "A Failure Triage Engine Based on Error Trace Signature Extraction", On-Line Testing Sympsium (IOLTS), Jul. 8, 2013, 6 pages.

(Continued)

*Primary Examiner* — Phallaka Kik

(57) ABSTRACT

A device simulation system performs a set of tests by applying, for each test in the set, a corresponding test stimulus to a simulation of the electronic device. In response to each test stimulus, the simulation generates corresponding output information which the device simulation system compares to a specified expected outcome to identify a test result for that test stimulus. In addition, for each test stimulus, the device simulation system generates test coverage information indicating the particular configuration of the simulated electronic device that resulted from the stimulus. The device simulation system correlates the coverage information with the test results to identify correlation rules that indicate potential relationships between test results and configurations of the simulated device.

20 Claims, 3 Drawing Sheets

(56) References Cited

U.S. PATENT DOCUMENTS

| | | | | |
|---|---|---|---|---|
| 2009/0037858 A1* | 2/2009 | Thakur | G06F 17/5081 | 716/106 |
| 2009/0287965 A1* | 11/2009 | Oishi | G06F 17/504 | 714/45 |
| 2010/0146339 A1* | 6/2010 | Hansson | G06F 11/3676 | 714/37 |
| 2010/0235814 A1* | 9/2010 | Ohta | G06F 11/3684 | 717/124 |
| 2012/0198399 A1 | 8/2012 | Safarpour et al. | | |
| 2012/0304031 A1* | 11/2012 | Shah | G06F 11/263 | 714/729 |
| 2015/0213169 A1* | 7/2015 | Meyer | G06F 17/5045 | 716/107 |
| 2015/0213173 A1* | 7/2015 | Meyer | G06F 17/5045 | 703/14 |
| 2015/0213174 A1* | 7/2015 | Meyer | G06F 17/5036 | 703/16 |

OTHER PUBLICATIONS

Frank Rogin et al. "Automatic Debudding of System-On-A-Chip Designs", SOC Conference, 2009, 4 pages.

* cited by examiner

CORRELATION OF TEST RESULTS AND TEST COVERAGE FOR AN ELECTRONIC DEVICE DESIGN

BACKGROUND

1. Field of the Disclosure

The present disclosure relates generally to electronic devices and more particularly to testing and verification of electronic device designs.

2. Description of the Related Art

A typical design flow for an electronic device includes design verification, wherein the expected operation of the electronic device is compared to a device specification. Because of the expense of building test devices, the design verification is frequently conducted using software-based automated design tools that simulate the expected operation of the electronic device, as indicated by a data file reflecting the electronic device design. Modern electronic devices often can be configured in a variety of different ways and employed for a variety of different purposes, and thus it is typically desirable to simulate operation of the electronic device under a variety of simulated conditions and configurations. Accordingly, design verification proceeds by simulating the operation of the electronic device under a large number of test stimuli that correspond to different simulated conditions and configurations. In response to each test stimulus, the simulated electronic device provides output information that is compared to the device specification to determine a test result. However, because of the large number of test stimuli it can be difficult to identify what causes each test to result in a pass or fail result, and therefore difficult to identify problems in the device design or problems in the test stimuli.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION OF EMBODIMENT(S)

Figure 1:
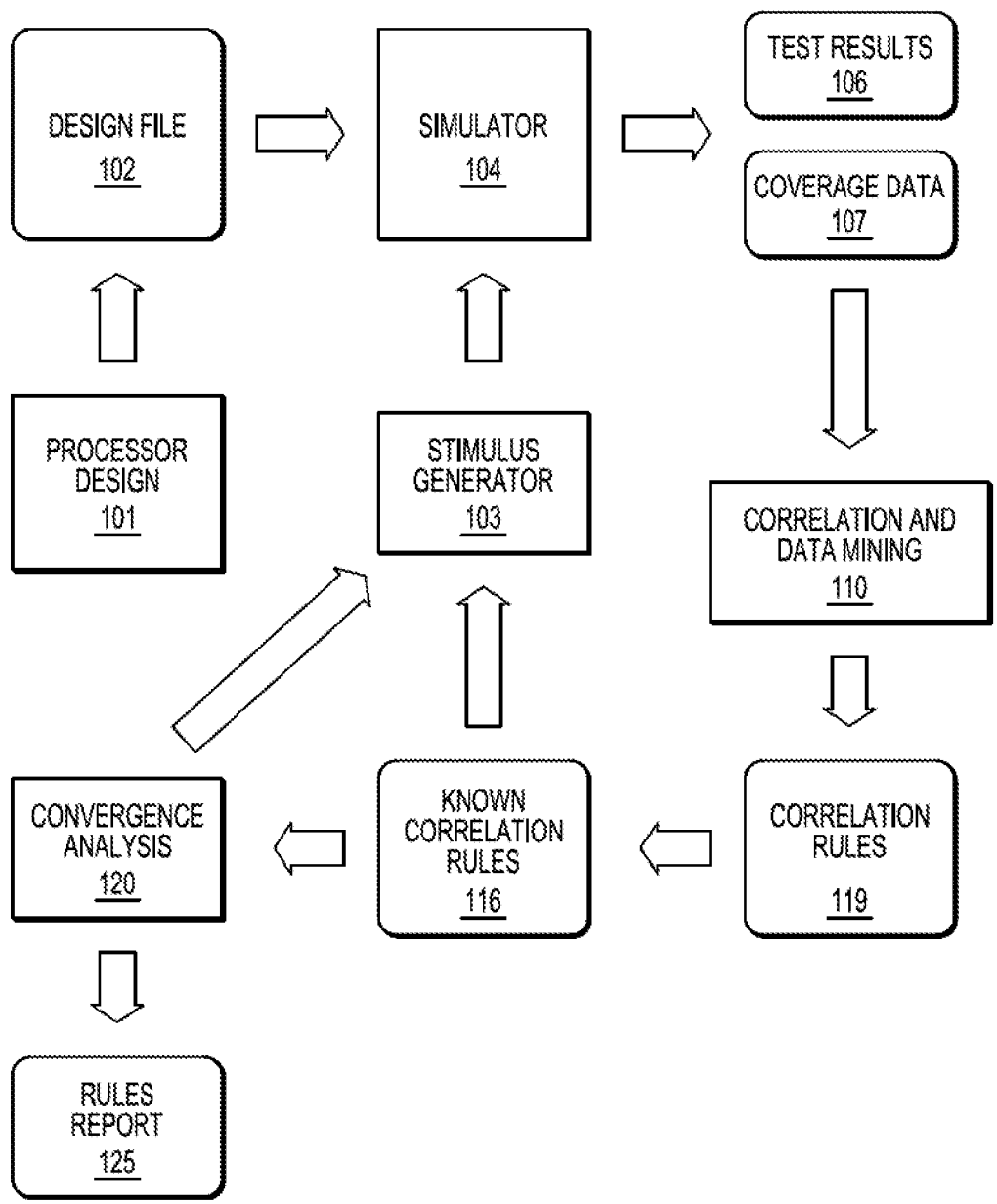
FIG. 1 is a block diagram of a design verification system employing a static model in accordance with at least one embodiment of the present disclosure.

FIGS. 1-4 illustrate techniques for identifying and correcting problems in an electronic device design by correlating test results for a set of tests of the electronic device design with test coverage for the set of tests. In one embodiment, a device simulation system performs the set of tests by applying, for each test in the set, a corresponding test stimulus to a simulation of the electronic device. In response to each test stimulus, the simulation generates corresponding output information which the device simulation system compares to a specified expected outcome to identify a test result (e.g., pass or fail) for that test stimulus. In addition, the system generates test coverage information indicating the particular configurations of the simulated electronic device that are to be simulated. The device simulation system correlates the coverage information with the test results to identify correlation rules that indicate potential relationships between test results and configurations of the simulated device. The correlation rules can be used by the device simulation system to identify problems in the electronic device design, which can then be addressed by changing the design itself, by changing the permitted operating conditions of the device, and the like. In at least one embodiment, the device simulation system uses the correlation of coverage information and test results to generate additional test stimuli for further testing. The device simulation system can iteratively repeat the testing, correlation, and stimuli generation until the correlation rules are confirmed with a specified level of confidence.

To illustrate via an example, the condition of a given electronic device can be represented by 6 different binary configuration variables, designated "A", "B", "C", "D", "E", and "F." Each of the configuration variables indicates whether a particular condition pertains at the device being simulated. For example, configuration variable A can indicate whether the device is in a low power mode, wherein when A is true (denoted simply as "A") the device is in the low power mode and when A is not true (denoted as "!A") the electronic device is not in the low power mode. To test the electronic device, the device simulation system applies a set of stimuli to a simulation of the electronic device. In response to a stimulus, the simulation places one or more of the configuration variables in corresponding states as mandated by the device design and generates configuration information indicating the state of the configuration variables resulting from the stimulus. In addition, the simulation generates output information as mandated by the device design. The device simulation system compares the output information to specified expected output information to determine a test result for the system. In at least one embodiment the test result can be a "pass" result (when the output information matches the expected output information) or a "fail" result (when the output information does not match). In at least one embodiment, the coverage information is not generated directly by the simulation, but is generated by the system in conjunction with generating the stimulus. For example, the stimulus can be generated by a stimulus generator such that the coverage information is an intrinsic property of the stimulus.

It will be appreciated that, while in the above example both the configuration variables and test results are expressed as binary variables, in other embodiments either the configuration variables, the test results, or both, could be expressed as variables that can take on more than two values or states. For example, in one embodiment a given configuration variable could be expressed as a variable that can have any of three different values or states, each corresponding to a different mode of a particular module of the electronic device. In another embodiment the test results may not be expressed as a simple pass or fail result but as an integer range of power or performance metrics. Further the test results can be expressed as ranges of different metrics for the same performance or power characteristic.

In order to ensure that the device design is tested under a wide range of potential conditions, the device simulation system applies a variety of stimuli to the simulation, thereby generating a set of test results and corresponding coverage information. The device simulation system then correlates the test results with the coverage information to identify the states of the configuration variables and how those states correlate with the test results. These correlations can then be used to identify potential errors in the device design. For example, the correlations may indicate a "fail" result a large percentage of the time when the configuration variables C and D are both in true states. This information can be used to identify that there is a potential problem in the way that the modules or conditions implied by C and D interact. For example, C and D may be condition variables that indicate, respectively, that a wireless radio and a serial interface of the electronic device are active. The fact that there is a high degree of failure when both of these modules are active can indicate, for example, whether the two modules are apparently attempting to simultaneously use the same device pin or other resource and, if so, assign separate pins or other resources to the two modules. Thus, by correlating the test results and the coverage information, potential problems can be identified relatively quickly. Conventional simulation systems, in contrast, can provide information about error conditions that triggered a fail result, but not the device configurations that are likely to have caused the error conditions. As such, it is more difficult to identify the source of the error conditions and more difficult to identify stimuli that incorrectly cause the device to be placed in a configuration that is ruled out by a device specification.

In another embodiment, the states of the configuration variables can be correlated to test results having a greater range of possible values or states, such as a range of performance metrics. This correlation can indicate, for example, correlations between particular device configurations and corresponding device power consumption, device temperature, device operating frequency, and the like, or combinations thereof.

FIG. 1 illustrates a block diagram of a device simulation system 100 in accordance with at least one embodiment of the present disclosure. The device simulation system 100 is implemented at a computer system, such as a desktop computer, workstation, server, or combination thereof. The individual modules of the design simulation system 100 described below can reflect individual or collective software programs, hardware devices, or combinations thereof. Further, although illustrated and described individually, each of the modules described below can represent a portion of a larger software program, hardware device, or combination thereof.

The device simulation system 100 is generally configured to simulate one or more aspects of an electronic device design. For purposes of description, the device simulation system 100 is described with respect to a processor design 101. However, it will be appreciated that the techniques disclosed herein can be applied to any electronic device design, including integrated circuit designs, system-on-a-chip designs, consumer electronic device designs, and the like.

The processor design 101 reflects the modules of a designed processor device, or portions thereof, the behavior of those modules, and the relationships between the modules and their behaviors. The processor design 101 can be a data file, a written set of device specifications, a conceptual framework for processor, or a combination thereof. In at least one embodiment, the processor design 101 is instantiated as a design file 102 that embodies a description of features of a processor, or the interpretation of processor features by a designer. In at least one embodiment, the design file 102 is set forth in a machine interpretable data file, such as a hardware description language (HDL) file in compliance with the Verilog™ hardware description language, that describes the modules, behaviors, and relationships reflected in the processor design 101 in a format that can be interpreted by one or more computer aided design tools. The data file can be stored on a computer-readable storage medium of a computer system implementing the device simulation system 100.

The device simulation system 100 includes a stimulus generator 103, a simulator 104, a correlation and data mining module 110, and a convergence analysis module 120. The stimulus generator 103 is a module (e.g., an automated design tool) configured to generate stimuli in the form of input values or other stimuli that can be applied to a simulation of an electronic device. In at least one embodiment, the stimulus generator 103 can generate the stimuli randomly—i.e. the stimulus generator 103 can generate the input values as a set of random values. In addition, in some embodiments the stimulus generator 103 can generate targeted stimuli that are input values generated to place one or more configuration variables of a simulated device in a specified state. To generate targeted stimuli, the stimulus generator 103 is provided with information indicating the specified states of the configuration variables. In response, the stimulus generator 103 generates one or more input values that are known or expected to place the configuration variables in the specified state. In at least one embodiment, the input values generated by the stimulus generator 103 based on constraints provided by a user to ensure that particular configurations are tested.

The simulator 104 is a module that simulates the behavior of an electronic device, as described by the design file 102, in response to input values or other stimuli generated by the stimulus generator 103. In at least one embodiment, the simulator 104 is a computer device and associated software that, when executed, receives a set of configuration variables based on the design file 102 and corresponding to potential configurations of the modules of the electronic device represented by the processor design 101. The simulator 104 further receives, based on the design file 102, relationships between the configuration variables. These relationships are mandated or implied by the relationships between the modules of the processor design 101.

The simulator 104 is generally configured to determine, in response to a given stimulus, the state of each configuration variable, and further to generate an output value indicative of the behavior of the simulated electronic device in response to the stimulus. The simulator 104 compares the output value to a specified expected value (not shown) to determine a test result, wherein the test result is indicated as a "pass" result when the output value matches the expected value and a "fail" result when the output value differs from the expected value. The simulator 104 stores the test result as one of test results 106. In addition, the simulator 104 receives the state of each configuration variable in the simulation that generated the output value as an entry at coverage data 107. Thus, each entry of the coverage data 107 will include a corresponding entry of the test results 106 indicating whether the configuration was associated with a passed or failed test. In at least one embodiment, each entry of the coverage data 107 is expressed as a logical string of configuration variables. For example the entry: A&C&! D indicates that the simulation placed the configuration variables A and C in the true state and placed the configuration variable D in a false state. In at least one embodiment, the each entry can be expressed as a table indicating the binary value of each configuration variable. Thus, in the example above, the entry could be expressed as a table indicating A=1, B=1, and D=0. Further, in at least one embodiment, the entries of the coverage data 107 are generated by the stimulus generator 103, rather than by the simulator 104.

The particular electronic device state or behavior implied by the state of a configuration variable depends on the aspect of the device design represented by that behavior. For example, configuration variable A may correspond to a particular mode of operation of a particular module of the electronic device. Accordingly, variable A being placed in the true state indicates that the simulator 104, during the corresponding simulation, placed the module into that mode of operation, whereas variable A being placed in the false state indicated that the simulator 104 placed the module into a different mode of operation. In contrast, variable D may indicate whether a particular pin of the electronic device is being used, such that variable D being placed in the true state indicates the pin is being used while variable D being in the false state indicates that the pin was not used. It will be appreciated that some configuration variables are omitted from individual entries of the coverage data 107, indicating that those variables were not exercised (that is, were not definitively placed in a true or false state) by the corresponding simulation, but instead were left in a default state (e.g., a state after a reset of the device.

The correlation and data mining module 110 is a module configured to identify correlations between the test results 106 and the states of the configuration variables reflected in the coverage data 107. Accordingly, the correlation and data mining module 110 analyzes different potential combinations of configuration variable states, as indicated by entries of the coverage data 107, and correlates those combinations of configuration variable states with the test results 106 to generate correlation rules 115. In at least one embodiment, the correlation and data mining module includes two different types of data mining engines: a classification engine and a rule induction engine. The classification engine analyzes the test results 106 and the corresponding coverage data 107 to differentiate between different combinations of configuration variables. The rule induction engine uses the test results 106 and the coverage data 107 to identify combinations of configuration variables that imply pass or fail test results. Each engine provides a set of correlation rules, which are combined to form the correlation rules 115.

In at least one embodiment, each engine generates a support value, indicating the number of combinations of configuration variables that support a given correlation rule, and a confidence value, indicating the percentage of a given state of configuration variables indicates a particular test result, wherein the particular test result depends on the type of rule. That is, for some rules, the confidence value can indicate, for example, the percentage of a given state of configuration variables that indicate a pass test result. For other correlation rules, the confidence value can indicate, for example, the percentage of a different state of configuration variables that indicate a fail test result. For still other correlation rules, the confidence value can indicate the percentage of another state of configuration variables that indicate a performance metric that exceeds a specified threshold (e.g. the percentage of tests placing configuration variables A&B in a true state that result in a particular current at the device exceeding 1.2 Amps). The correlation rules generated by each engine are filtered based on a threshold support level, threshold confidence level, or combination thereof, and the filtered correlation rules from each engine are combined to form the correlation rules 115.

As described further below with respect to FIG. 2, each correlation rule indicates a particular combination of configuration variable states, and the number of passed or failed test results associated with that combination. Thus, a correlation rule indicating a high correlation between a particular combination of configuration variable states and failed test results indicates that the modules corresponding to the configuration variables (or the combination thereof) may be a fruitful avenue of investigation for errors in the electronic device design. For example, if the correlation rules 115 indicate that there is a high correlation between failed test results and a particular module being placed in a particular mode of operation, as indicated by the corresponding configuration variable, that module and mode of operation can be targeted for further analysis.

A single set of tests at the simulator 104 may be insufficient to generate correlation rules with a high degree of confidence that correlations indicate actual problems in the device design. Accordingly, as described further below, the device simulation system 100 may iteratively run several sets of simulations, using different stimuli, at the simulator 104, thereby generating several sets of correlation rules 115. The convergence analysis module 120 is configured to analyze the several sets of correlation rules 115 and identify which of the rules converge (i.e. which rules are the same or similar over multiple sets). In at least one embodiment, the convergence analysis module 120 identifies trends in one or more aspects of the several sets of correlation rules 115, such as trends in the number of "strong rules" (i.e. rules that have more than a threshold level of support, confidence, or combination thereof), trends in the number of "weak ruled" (i.e. rules that have less than a threshold level of support, confidence, or combination thereof, trends in the number of simulations or test cases, trends in the amount of time it takes to execute the simulations or test cases, trends in the amount of resources (e.g., memory, run-time, or other resources) used to execute the simulations or test cases, and trends in ratios of pass test results to fail test results. These trends can be identified based on the correlation rules 115 as a whole, or on an engine-by-engine basis according to the correlation rules generated by each individual data mining engine at the correlation and data mining module 110. The trends can be represented as a virtual crawl chart such that the chart indicates the convergence for different ones of the correlation rules 115.

In at least one embodiment, the convergence analysis module 120 represents the coverage data 107 associated with the correlation rules 115 as an N-dimensional space and identifies the amount of overall coverage tested by the simulator 104 based on the percentage of volume or area of the N-dimensional space that is covered by the coverage data 107. In at least one other embodiment, the convergence analysis module identifies, in the N-dimensional space, a boundary between coverage data leading to pass test results and coverage data leading to fail test results. The convergence analysis module 120 can identify the surface area defined by the boundary and the size of the boundary's perimeter identify the amount of the N-dimensional space that is near the boundary. This amount of space indicates the degree of uncertainty in the correlation rules 115.

Based on analysis of the correlation rules 115, the convergence analysis module 120 can modify a corresponding strength value for each correlation rule. In response to a strength value for a correlation rule exceeding a threshold value, the convergence analysis module 120 can record the rule in a rules report 125 for subsequent review and analysis.

In operation, the simulator 104 receives the configuration variables and relationships between the configuration variables for the electronic device from the design file 102. The stimulus generator 103 generates a variety of random stimuli in sufficient number that the range of configuration variable state combinations (the "configuration space") expected to be simulated at the simulator 104 is also expected to be relatively large. For each stimulus, the simulator 104 simulates operation of the electronic device and generates a corresponding output value. The simulator 104 compares each output value to a corresponding expected value, and based on the comparison indicates a pass or fail test result at the test results 106. In addition, the simulator 104 records the state of the configuration variables for each simulation at the coverage data 107.

The correlation and data mining module 110 correlates the test results 106 and the coverage data 107 to identify the correlation rules 115. The device simulation system 100 merges the correlation rules 115 with known correlation rules 116 that have been identified from previous simulations. The convergence analysis module 120 identifies similarities between the correlation rules 115 and the known correlation rules 116 and, based on the similarities, adjusts a confidence measurement for each correlation rule. To illustrate, the known correlation rules 116 may indicate a relatively high correlation between a particular combination of configuration variable states and test failures. If the correlation rules 115 indicate the same, or higher, correlation between the combination of configuration variable states and test failures, the convergence analysis module 120 increases the strength value for the corresponding correlation rule. If the correlation rules 116 indicate a lower correlation between the combination of configuration variable states and test failures, the convergence analysis module 120 decreases the strength value for the corresponding correlation rule.

The stimulus generator 103 analyzes the known correlation rules 116, after they have been merged with the correlation rules 115. In response to the correlation for a particular rule being within a specified range, the stimulus generator 103 generates a stimulus, or multiple stimuli, configured to further test the combination of configuration variables corresponding to the correlation rule. To illustrate via an example, one of the known correlation rules 116 can indicate a 65% correlation between configuration variables A&B being in true states and failed test results. This indicates that A&B being in true states may be a cause of test failures, but it would be useful to perform further simulations where these variables are in true states to determine if the correlation can be strengthened. For example, in some scenarios, additional simulations may provide further confirmation that A&B being in true states causes test failures. In other scenarios additional testing may show that A&B being in true states alone does not cause a significant amount of test failures, but A&B being in true states along with other configuration variables being in true states does result in a significant amount of test failures. In still other scenarios, the additional simulations can indicate that the test failures when A&B being in true states is likely coincidental. To identify which scenario pertains, the stimulus generator 103 can generate additional stimuli that are known or expected to place the configuration variables in true states. In at least one embodiment, the stimulus generator 103 ensures that the new stimuli are different from any previous stimulus used in previous simulations.

The simulator 104 applies the new set of stimuli, to generate new test results and coverage data, which the correlation and data mining module 110 in turn uses to generate new correlation rules 115. The device simulation system 100 again merges the correlation rules 115 with the known correlation rules 116, and the convergence analysis module 120 again adjusts confidence values for the correlation rules as described above. The device simulation system 100 can iteratively repeat the process of generating new stimuli, new test results and coverage data, new correlation rules, merger of correlation rules, and adjustment of confidence values, until one or more of a variety of threshold values are reached. For example, the device simulation system 100 can halt the simulation process after a specified amount of time, in response to a specified number of correlation rules achieving specified threshold confidence values, a specified number of simulations, a specified number of simulations being executed without adjustment of a threshold number of confidence values for correlation rules, and the like.

In response to the device simulation system 100 halting the simulation process, the convergence analysis module 120 can report the correlation rules and corresponding confidence values in a rules report 125. In at least one embodiment, the convergence analysis module reports a threshold number of correlation rules having higher confidence values. The rules report 125 can be analyzed to identify potential errors at the processor design 101 or errors in the test environment, such as, for example, errors in the stimuli generated by the stimulus generator 103. For example, if a correlation rule having a high degree of confidence indicates that a particular module of the processor design 101 has a high correlation with failed test results, that module can be analyzed, and its design adjusted.

Figures 2, 3:
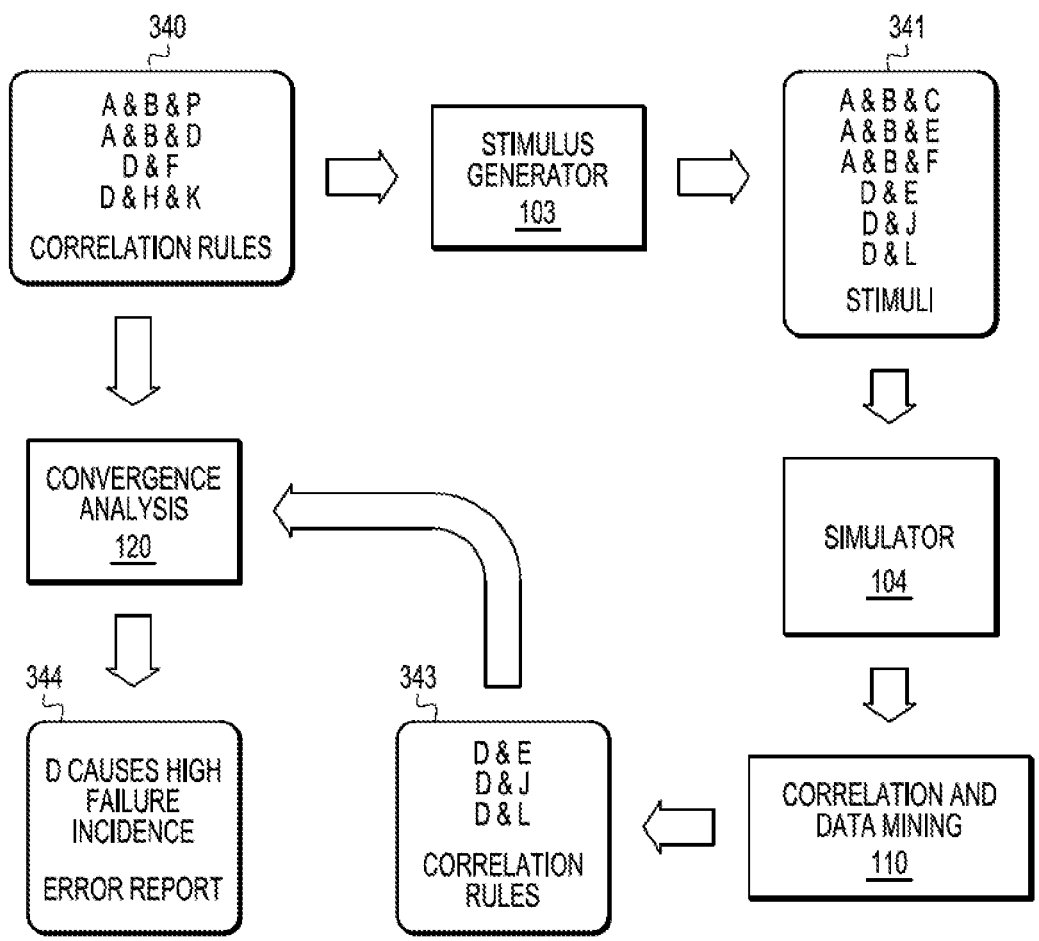
FIG. 2 is a diagram illustrating an example of correlation rules generated at the device simulation system of FIG. 1 in accordance with at least one embodiment of the present disclosure.
FIG. 3 is a diagram of an example operation of the device simulation system 100 of FIG. 1 in accordance with at least one embodiment of the present disclosure.

FIG. 2 illustrates an example of the correlation rules 115 in accordance with at least one embodiment of the present disclosure. In the depicted example, the correlation rules includes a plurality of entries (e.g., entry 235), wherein each entry includes a samples field 231, a failure rate field 232, and a configuration variable state field 233. The configuration variable state field 233 sets forth the combination of configuration variables for the correlation rule corresponding to the entry. For example, entry 235 includes a configuration variable state field having the value "A&B", indicating that for the correlation rule set forth at entry 235 configuration variables A and B are both in true states. The sample field 231 indicates the number of simulations executed at the simulator 104 for which the configuration variables were set to the state indicated at the configuration variable state field 233. For example, the sample field 231 for the entry 235 indicates that the simulator 104 executed 425 different simulations (based on 425 corresponding stimuli) that resulted in the configuration variables A and B both being placed in true states. The failure rate field 232 indicates, for the simulations that resulted in the combination of configuration variables set forth at the configuration variable state field 233, the percentage of test results having a fail result. For example, the failure rate field 232 for the entry 235 is 88 percent. Thus the correlation rule for the entry 235 indicates that, for the 425 simulations wherein the configuration variables A and B were both set to true states, the resulting test results indicated a failure 88% of the time.

In at least one embodiment, the convergence analysis module 120 uses both the samples field 231 and the failure rate field 232 to generate a confidence value and a support value for each correlation rule. The support value indicates the number of simulations or test cases that have tested the corresponding correlation rule. That is, the number of simulations or test cases where the configuration variables have been placed in the states indicated by the corresponding rule. The confidence value indicates the percentage of simulations or test cases for the correlation rule that resulted in a fail test result (in some embodiments the confidence value can be expressed as the percentage o ratio of simulations that resulted in a pass test result). The convergence analysis module 120 analyzes the support value and the confidence value for each correlation rule over time to identify trends in the confidence value, and identifies a strength value for each correlation rule based on the trends. For example, as the confidence value for a correlation rule tends towards one or the other extreme of the possible range of confidence values (e.g., towards 100% or towards 0%) as the support value for the rule increases, the convergence analysis module 120 increases the strength value for the correlation rule. As the confidence value for a correlation rule tends towards the center of the possible range of confidence values (e.g., towards 50%) as the support value for the rule increases, the convergence analysis module 120 decreases the strength value for the correlation rule. The strength value for a correlation rule thus indicates whether the correlation rule has tended to be confirmed or refuted by testing.

FIG. 3 is a block diagram illustrating an example operation of the device simulation system 100 of FIG. 1 in accordance with at least one embodiment of the present invention. In the depicted example, the device simulation system 100 has previously generated correlation rules 340 that indicate a relatively high number of fail test results for configuration states wherein the configuration variables A and B are set to true states, and wherein the configuration variable D is set to a true state. However, because there is at least one correlation rule having a high failure rate wherein A, B and D are all in true states, the high number of test failures could be the result of either A and B being in true states, D being in a true state, or both. The convergence analysis module 120 therefore cannot generate a high confidence value for any of the combinations of configuration variables depicted at the correlation rules 340. Accordingly, the stimulus generator 103 generates stimuli 341 based on the correlation rules to conduct additional simulations wherein either the A and B configuration variables are placed in true states or the configuration variable D is placed in a true state. As explained below, these additional stimuli 341 are used to generate additional test results with the goal of differentiating between which of the configuration variable states has a higher correlation with fail test results.

The simulator 104 uses the stimuli 341 to generate coverage data and test results, which are correlated by the correlation and data mining module 110 to generate correlation rules 343. In the depicted example, the correlation rules 343 indicate failed test results for different combinations of configuration variables wherein the configuration variable D is in a true state. However, the correlation rules 343 do not indicate failed test results for combinations of configuration variables wherein the configuration variables A&B are in true states. The convergence analysis module 120 analyzes the correlation rules 343 together with the correlation rules 340, and identifies a higher failure rate for correlation rules wherein D is in a true state. Accordingly, the convergence analysis module 120 indicates a high failure incidence for the configuration variable D at a rules report 344. This information can be used by an engineer or automated design tool to further analyze the design of the module or mode of operation corresponding to the configuration variable D and make any necessary adjustments to that design to lower or eliminate the test failures.

Figure 4:
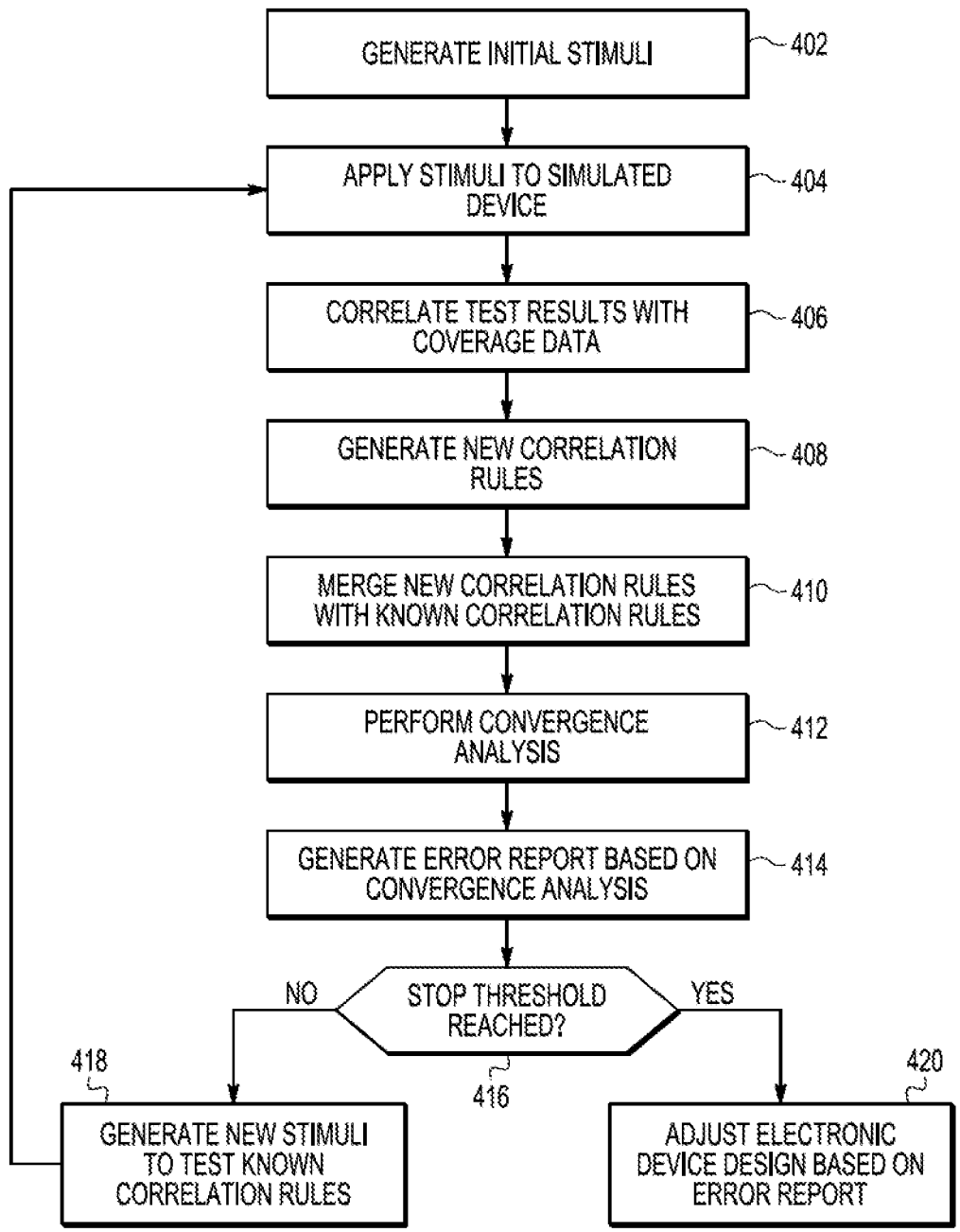
FIG. 4 is a flow diagram of a method of correlating test results and coverage data at the device simulation system of FIG. 1 in accordance with at least one embodiment of the present disclosure

FIG. 4 illustrates a flow diagram of a method of correlating test results and coverage data at the device simulation system of FIG. 1 in accordance with at least one embodiment of the present disclosure. At block 402, the stimulus generator 103 generates initial stimuli for application to the simulator 104. In at least one embodiment, the initial stimuli are a set of random values. At block 404 the simulator 104 applies the stimuli to a simulated electronic device as reflected in the design file 102. Based on the stimuli, the simulator 104 generates the test results 106, indicating which of the stimuli resulted in generation of output values matching expected output values. In addition, the simulator 104 generates the coverage data 107, indicating the state of the configuration variables set by the simulator for each stimulus.

At block 406 the correlation and data mining module 110 correlates the test results 106 and the coverage data 107 to generate the correlation rules 115 at block 408. At block 410 the device simulation system 100 merges the correlation rules 115 with known correlation rules 116. For example, the device simulation system 100 can identify entries of the correlation rules 115 having a configuration variable state field that matches the configuration variable state field of an entry of the known correlation rules 116. The device simulation system 100 can merge the corresponding entries by identifying equivalent rules (e.g., A&B and B&A) and merging the equivalent rules into a single rule. The device simulation system 100 can also merge rules by identifying rules that are subsets of another "parent" rule (e.g., A&B and A&B&C, where A&B is the parent rule) and merging the subset into the parent rule.

At block 412 the convergence analysis module 120 adjusts the strength values for the correlation rules 116 based on changes resulting from the merger at block 410. At block 414 the convergence analysis module 120 generates the rules report 125 to indicate combinations of configuration variables having a strength value that exceeds a threshold, indicating that these combinations of configuration variables are associated with a high rate of fail (or high rate of pass) test results, for a sufficient number of simulations or test cases, at the simulator 104. At block 416 the device simulation system 100 identifies whether a stop threshold has been reached. The stop threshold can reflect a number of simulations at the simulator 104, an amount of time, a number of items listed in the rules report 125, a threshold number of correlation rules are associated with at least a threshold strength value, and the like, or any combination thereof. If the stop threshold has not been reached, the method flow moves to block 418 and the stimulus generator 103 generates new stimuli to further test the known correlation rules 116. For example, the stimulus generator can generate additional stimuli that will generate simulations that place configuration variables in states reflected in the configuration variable state entries of the known correlation rules 116. The method flow returns to block 404, where the new stimuli are applied to the simulator 104.

Thus, the method 400 proceeds iteratively, generating and applying new stimuli to the simulator 104 and generating test results, coverage data, and corresponding correlation rules 115, until the stop threshold is reached. In response to, at block 416, the stop threshold being reached, the method flow moves to block 420 and a design tool uses the rules report 125 to identify aspects of the processor design 101 that need adjustment. The design tool makes adjustments to the design, which can then proceed to further simulation or other testing.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A computer-implemented method comprising:
   applying first stimuli to a simulation of an electronic device design to generate a first plurality of test results;
   correlating the first plurality of test results with first coverage data to identify first correlation rules indicating correlations between the first plurality of test results and configurations of modules of the electronic device design, the first coverage data indicating states of a plurality of configuration variables representing configurations of modules of the electronic device design;
   modifying data files corresponding to the electronic device design based on the first correlation rules; and
   fabricating an electronic device based on the modified data files.

2. The method of claim 1, further comprising:
   generating second stimuli based on the first correlation rules.

3. The method of claim 2, further comprising:
   applying the second stimuli at the simulation of the electronic device design to generate a second plurality of test results based on the electronic device design.

4. The method of claim 3, further comprising:
   correlating the second plurality of test results with second coverage data to identify second correlation rules for the electronic device design.

5. The method of claim 4, further comprising:
   identifying a strength value based on a first correlation rule of the first correlation rules and a corresponding second correlation rule of the second correlation rules, the strength value indicative of a confidence associated with the first correlation rule and a number of simulations associated with the first correlation rule.

6. The method of claim 5, further comprising:
   identifying the first correlation rule in an rules report based on the strength value.

7. The method of claim 4, further comprising:
   iteratively generating stimuli and correlation rules based on the first correlation rules until a stop threshold is reached.

8. The method of claim 7, wherein the stop threshold is based on a number of simulations of the electronic device design.

9. The method of claim 7, wherein the stop threshold is based on an amount of time.

10. The method of claim 7, wherein the stop threshold is based on a number of correlation rules being associated with a threshold confidence value.

11. A device simulation system, comprising:
    a stimulus generator to generate stimuli;
    a simulator to simulate operation of an electronic device based on the stimuli and an electronic device design to generate a test results; and
    a correlation and data mining module to correlate the test results with coverage data to identify correlation rules indicating correlations between the test results and configurations of modules of the electronic device design, the coverage data indicating states of a plurality of configuration variables representing configurations of modules of the electronic device design, and to modify data files corresponding to the electronic device design, and to fabricate an electronic device based on the modified data files.

12. A non-transitory computer-readable media tangibly embodying a set of executable instructions, the set of executable instructions to manipulate at least one processor to:
    apply first stimuli at a simulation of an electronic device design to generate a first plurality of test results and first coverage data;
    correlate the first plurality of test results with the first coverage data to identify first correlation rules indicating correlations between the first plurality of test results and configurations of modules of the electronic device design, the first coverage data indicating states of a plurality of configuration variables representing the configurations of modules of the electronic device design;

modify data files corresponding to the electronic device design based on the first correlation rules; and
fabricate an electronic device based on the modified data files.

13. The computer-readable media of claim 12, further comprising instructions to:
generate second stimuli based on the first correlation rules.

14. The computer-readable media of claim 13, further comprising instructions to:
apply the second stimuli to generate a second plurality of test results based on the electronic device design.

15. The computer-readable media of claim 14, further comprising instructions to:
correlate the second plurality of test results with second coverage data to identify second correlation rules for the electronic device design.

16. The computer-readable media of claim 15, further comprising instructions to:
identify a strength value based on a first correlation rule of the first correlation rules and a corresponding second correlation rule of the second correlation rules.

17. The computer-readable media of claim 16, further comprising instructions to:
identify the first correlation rule in a rules report based on the strength value.

18. The computer-readable media of claim 15, further comprising instructions to:
iteratively generate stimuli and correlation rules based on the first correlation rules until a stop threshold is reached.

19. The computer-readable media of claim 18, wherein the stop threshold is based on a number of simulations of the electronic device design.

20. The computer-readable media of claim 18, wherein the stop threshold is based on an amount of time.

* * * * *